(12) United States Patent
Thomsen et al.

(10) Patent No.: US 8,354,586 B2
(45) Date of Patent: Jan. 15, 2013

(54) TRANSPARENT CONDUCTOR FILM STACK WITH CADMIUM STANNATE, CORRESPONDING PHOTOVOLTAIC DEVICE, AND METHOD OF MAKING SAME

(75) Inventors: Scott V. Thomsen, South Lyon, MI (US); Willem den Boer, Brighton, MI (US); Yiwei Lu, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 221 days.

(21) Appl. No.: 12/923,672

(22) Filed: Oct. 1, 2010

(65) Prior Publication Data

US 2012/0080090 A1 Apr. 5, 2012

(51) Int. Cl.
*H01L 31/0224* (2006.01)
(52) U.S. Cl. .......... 136/256; 136/252; 136/260; 438/84; 438/86; 438/95; 438/98
(58) Field of Classification Search .................. 136/256, 136/260; 438/84, 86, 95, 98
See application file for complete search history.

(56) References Cited

U.S. PATENT DOCUMENTS

| | | | |
|---|---|---|---|
| 4,349,425 A | 9/1982 | Miyake et al. | |
| 6,123,824 A | 9/2000 | Sano et al. | |
| 6,137,048 A | 10/2000 | Wu et al. | |
| 6,169,246 B1 | 1/2001 | Wu et al. | |
| 6,288,325 B1 | 9/2001 | Jansen et al. | |
| 6,613,603 B1 | 9/2003 | Sano | |
| 6,784,361 B2 | 8/2004 | Carlson et al. | |
| 6,858,461 B2 | 2/2005 | Oswald et al. | |
| 7,259,321 B2 | 8/2007 | Oswald et al. | |
| 2002/0011641 A1 | 1/2002 | Oswald et al. | |
| 2006/0169316 A1 | 8/2006 | Thomsen et al. | |
| 2006/0249199 A1 | 11/2006 | Thomsen et al. | |
| 2007/0184573 A1 | 8/2007 | Krasnov | |
| 2007/0193623 A1 | 8/2007 | Krasnov | |
| 2007/0215205 A1 | 9/2007 | Thomsen et al. | |
| 2008/0105303 A1 | 5/2008 | Oswald et al. | |
| 2008/0271675 A1 | 11/2008 | Choi et al. | |
| 2009/0014065 A1 | 1/2009 | Mueller et al. | |

(Continued)

FOREIGN PATENT DOCUMENTS

DE 10 2006 062 092 7/2008

(Continued)

OTHER PUBLICATIONS

U.S. Appl. No. 12/385,318, filed Apr. 3, 2009; Fulton et al.

(Continued)

*Primary Examiner* — Jennifer Michener
*Assistant Examiner* — Jayne Mershon
(74) *Attorney, Agent, or Firm* — Nixon & Vanderhye P.C.

(57) ABSTRACT

Certain example embodiments relate to a transparent conductor film stack with cadmium stannate used as a front contact layer and/or a buffer layer in a photovoltaic device or the like. The cadmium stannate-based layers may be provided between the front glass substrate and the semiconductor absorber film in a photovoltaic device (e.g., a CdS and/or CdTe based photovoltaic device). In certain example embodiments, the buffer layer based on cadmium stannate may have a higher resistivity than the transparent conductive oxide layer based on cadmium stannate. In certain example embodiments, one or more index matching layer(s) may be provided between the glass substrate and the layer(s) comprising cadmium stannate, e.g., to help overcome the optical mismatch between the glass substrate and the CdSnOx.

16 Claims, 6 Drawing Sheets

U.S. PATENT DOCUMENTS

| | | |
|---|---|---|
| 2009/0084438 A1* | 4/2009 | den Boer et al. ............... 136/256 |
| 2009/0165839 A1 | 7/2009 | Zeman et al. |
| 2009/0194165 A1* | 8/2009 | Murphy et al. ............... 136/260 |
| 2009/0217978 A1 | 9/2009 | Thomsen et al. |
| 2009/0223252 A1 | 9/2009 | Fulton et al. |
| 2009/0272437 A1 | 11/2009 | Roberts et al. |
| 2010/0122728 A1 | 5/2010 | Fulton et al. |
| 2010/0184249 A1 | 7/2010 | Chen |
| 2010/0186815 A1 | 7/2010 | Yang et al. |
| 2010/0206372 A1 | 8/2010 | Buller et al. |
| 2010/0212731 A1 | 8/2010 | Abken |
| 2010/0243437 A1 | 9/2010 | Gessert et al. |

FOREIGN PATENT DOCUMENTS

| | | |
|---|---|---|
| WO | WO 2010/059560 | 5/2010 |

OTHER PUBLICATIONS

International Search Report mailed Sep. 22, 2011.

"The Influence of Various Front Contact Materials on the Performance of CdTe Solar Cells", Mamazza et al., 2005 IEEE, Jan. 3, 2005.

\* cited by examiner

TRANSPARENT CONDUCTOR FILM STACK WITH CADMIUM STANNATE, CORRESPONDING PHOTOVOLTAIC DEVICE, AND METHOD OF MAKING SAME

Certain example embodiments of this invention relate to a transparent conductor film stack with cadmium stannate used as a front contact layer and/or a buffer layer in a photovoltaic device or the like. In certain example embodiments, the cadmium stannate-based layers may be provided between the front glass substrate and the semiconductor absorber film in a photovoltaic device. In certain example instances, one or more index matching layer(s) may be provided between the glass substrate and the layer(s) comprising cadmium stannate. In other example instances, a sodium effusion and/or diffusion barrier layer may also be provided between the glass substrate and the layer(s) comprising cadmium stannate. The cadmium stannate-based layer(s) may be deposited via sputtering, and may or may not be doped in certain example instances. In an example context of use in CdS/CdTe photovoltaic devices, the cadmium stannate-based layers used with the index matching layer(s) and optional sodium barrier layer(s) are advantageous in that they may (a) provide for high transmittance into semiconductors such as CdS and/or CdTe; (b) have low absorption, thus further increasing the transmittance; (c) allow the coating to have a high figure of merit; and/or (d) provide good durability when used with a sodium barrier layer, e.g., in terms of being able to better withstand the migration of sodium through the glass due to the elevated temperatures during CdS/CdTe deposition and/or processing.

BACKGROUND/SUMMARY OF CERTAIN EXAMPLE EMBODIMENTS OF THE INVENTION

Photovoltaic devices are known in the art (e.g., see U.S. Pat. Nos. 6,784,361, 6,288,325, 6,613,603 and 6,123,824, the disclosures of which are hereby incorporated herein by reference). Amorphous silicon (a-Si) and CdTe type (including CdS/CdTe) photovoltaic devices, for example, each include a front contact or electrode.

The high temperatures sometimes necessary for depositing the semiconductor may cause sodium effusion and/or diffusion from the glass to the semiconductor. Moreover, some transparent conductive oxide materials that exhibit favorable properties when used as a front contact may have an index of refraction higher than that of the glass, and thus may exhibit reflectance at the surface of the glass. Further, in certain instances, some transparent conductive oxide materials may be cost-prohibitive.

Thus, it will be appreciated that there exists a need in the art for a more efficient and/or improved photovoltaic device, and/or a front electrode structure therefor. It also will be appreciated that there is a need in the art for a technique for making or forming a TCO electrode structure.

Certain example embodiments of this invention relate to a buffer layer provided in connection with a front electrode in a photovoltaic device or the like. In certain example embodiments, a front electrode structure includes a cadmium stannate-based transparent conductive oxide (TCO) layer and/or a cadmium stannate-based buffer layer that are provided between the front glass substrate and the semiconductor absorber film in a photovoltaic device. The cadmium stannate-based TCO and/or buffer layer(s) may be deposited via sputtering or the like, and may or may not be doped in certain example instances. In an example context of CdS/CdTe photovoltaic devices, for example, the cadmium stannate-based layer(s) is/are advantageous that they may (a) provide for high transmittance into semiconductors such as CdS and/or CdTe; (b) have low absorption, thus further increasing the transmittance; (c) allow the coating to have a high figure of merit; and/or (d) provide good durability when used with a sodium barrier layer, e.g., in terms of being able to better withstand the migration of sodium through the glass due to the elevated temperatures during CdS/CdTe deposition and/or processing.

In certain example embodiments, the electrode structure (including the electrode and the buffer layer) may be used as any suitable electrode structure in any suitable electronic device, such as a photovoltaic device, electro-optical device, or the like. In certain example embodiments of this invention, the electrode structure may have a sheet resistance ($R_s$) of from about 7-50 ohms/square, more preferably from about 10-25 ohms/square, and most preferably from about 10-15 ohms/square using a reference example non-limiting thickness of from about 1,000 to 2,000 angstroms.

In certain example embodiments of this invention, there is provided photovoltaic device comprising: a front glass substrate and a plurality of thin film layer disposed thereon, the thin film layers comprising, in order moving outwardly from the front glass substrate: at least one index-matching layer, a transparent conductive oxide (TCO) layer comprising CdSnOx, a buffer layer comprising CdSnOx, wherein the buffer layer comprising CdSnOx has a resistivity higher than a resistivity of the TCO layer comprising CdSnOx, a semiconductor film comprising CdTe and/or CdS, and a rear contact layer, and a rear glass substrate.

In certain example embodiments of this invention, there is provided a photovoltaic device, the photovoltaic device comprising: a front glass substrate and a plurality of thin film layer disposed thereon, the thin film layers comprising, in order moving outwardly from the front glass substrate: a sodium barrier layer; a plurality of index matching layers including at least a high-index titanium oxide inclusive layer and a low index silicon-inclusive layer; a transparent conductive oxide (TCO) layer comprising CdSnOx; a buffer layer comprising CdSnOx, wherein the buffer layer has a higher resistivity than a resistivity of the TCO layer comprising CdSnOx; and a semiconductor film comprising CdS and/or CdTe.

In certain example embodiments of this invention, there is provided a method of making a photovoltaic device, the method comprising: providing a front glass substrate; sputter-depositing a barrier layer directly on the front glass substrate; sputter-depositing at least one index matching layer onto the glass substrate, over and contacting the barrier layer; sputter-depositing a transparent conductive oxide (TCO) layer comprising CdSnOx and having a resistivity of no greater than 0.4 mohm-cm and a refractive index from about 1.8 to 2.2, directly or indirectly, on the at least one index matching layer; and sputter-depositing a buffer layer comprising CdSnOx directly on the TCO layer, the buffer layer having a resistivity of at least about 10 mohm-cm.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
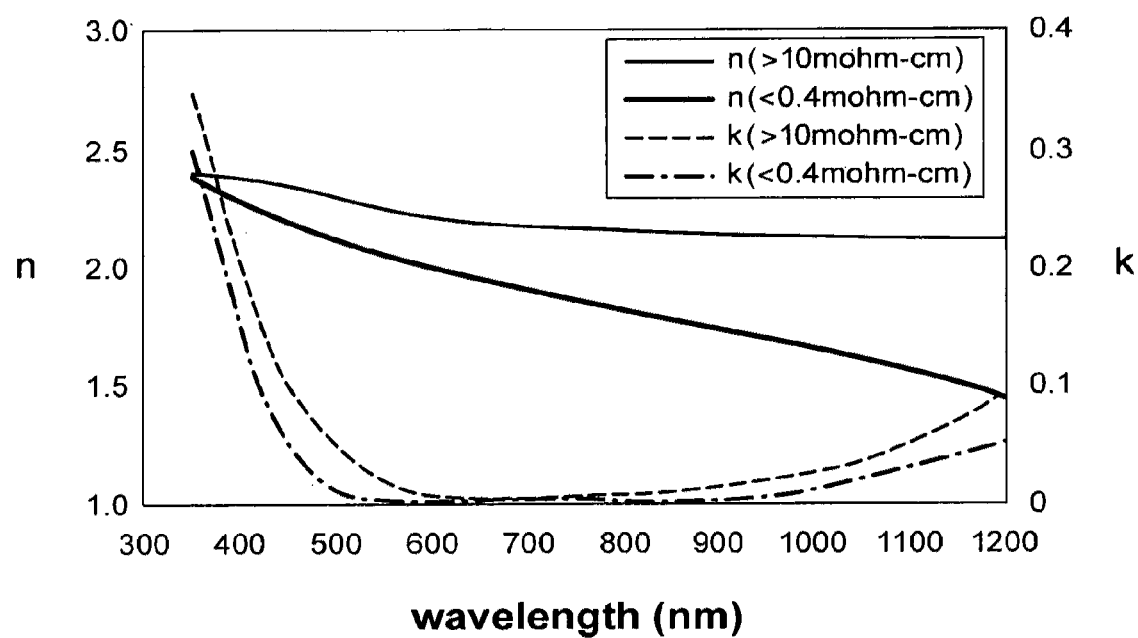
FIG. 1 is a graph of the optical properties of different cadmium stannate thin films made according to certain example embodiments of this invention.

Referring now more particularly to the drawings in which like reference numerals indicate like parts throughout the several views.

Transparent conductive oxides are used in thin film photovoltaic devices as a front contact/electrode in certain instances.

Photovoltaic devices such as solar cells convert solar radiation and other light into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, or any other suitable semiconductor material such as CdS, CdTe, and/or the like) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

While certain example embodiments of this invention may be especially useful in the context of CdS/CdTe type photovoltaic devices, this invention is not so limited. Electrode structures of this invention may be applicable to other types of photovoltaic devices as well, in certain example instances. For example, in certain example embodiments, single junction amorphous silicon (a-Si) photovoltaic devices include three semiconductor layers which make up a semiconductor film. In particular, a p-layer, an n-layer and an i-layer which is intrinsic. The amorphous silicon film (which may include one or more layers such as p, n, and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer, it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention may be directed toward amorphous-silicon based photovoltaic devices, this invention is not so limited and may be used in conjunction with other types of photovoltaic devices in certain instances including but not limited to devices including other types of semiconductor material, tandem thin-film solar cells, and the like. Moreover, electrode structures according to different embodiments of this invention may also be used in connection with CIS/CIGS and/or tandem a-Si type photovoltaic devices.

In certain example embodiments, it may be desirable to increase the transmission of light into the semiconductor of a photovoltaic device. Further, it may be desirable to decrease optical absorption by the TCO layer and/or other layers in the coating. In certain instances, sputter-depositing at least the TCO layer, and/or the coating, is desirable because coatings produced by sputtering may have excellent uniformity and may be easily reproducible.

A figure of merit is a quantity used to characterize the performance of a device, system or method, relative to its alternatives. In certain cases, figures of merit are defined for particular materials or devices in order to determine their relative utility for an application.

A figure of merit for a TCO layer is the ratio of sigma to alpha ($\sigma/\alpha$). Here, $\sigma$ is the conductivity, and $\alpha$ is the optical absorption coefficient. In certain instances, a high figure of merit is desirable, e.g., a higher conductivity and a lower optical absorption coefficient will produce a desirable coating.

For example, stoichiometric and non-stoichiometric cadmium stannate (e.g., $Cd_2SnO_4$ and/or $Cd_xSn_yO_z$) have a high figure of merit. In certain instances, cadmium stannate can have a resistivity as low as 0.13 milli-ohm-cm, as well as high transparency. Indium tin oxide (ITO) (e.g., $In_xSn_yO_z$) is another material with a high figure of merit.

In certain example instances, when a TCO layer is deposited on a glass substrate, significant reflectance at the glass may occur, e.g., because of the index of refraction mismatch between the glass and the TCO layer. In certain examples, glass has an index of refraction (n) of approximately 1.5. The index of refraction (n) of certain layers based on cadmium stannate may be around 2.0. Although cadmium stannate may be deposited to have a low resistivity and high transparency, and thus a high figure of merit, undesired interference and reflection loss may occur at the surface of the glass substrate because of the potential difference in the respective refractive indices of the glass substrate and the TCO layer based on cadmium stannate.

Therefore, in certain example embodiments, when a TCO layer based on cadmium stannate is used in a photovoltaic device, it may be advantageous to provide index-matching layers between the front glass substrate and the TCO layer based on cadmium stannate, e.g., in order to decrease reflection and increase transmission through the TCO layer of the photovoltaic device.

In some photovoltaic applications, the semiconductor may be deposited at temperatures exceeding 500 degrees C. At temperatures that high, sodium effusion and/or diffusion may occur from the glass to the semiconductor. In certain instances, it may be advantageous to provide a barrier layer somewhere in between the glass substrate and the semiconductor in order to reduce the amount of (and sometimes even prevent the occurrence of) sodium effusion and/or diffusion.

It has further been found that in certain example embodiments, cadmium stannate can be oxidized to different extents in order to alter the resistivity of the layer, as well as the refractive index of the layer. In certain instances, the resistivity of a layer based on cadmium stannate can be increased to at least 10 mohm-cm, and sometimes even greater. Further, in certain instances, the refractive index of a layer based on cadmium stannate may be adjusted within a range from 1.5 to 2.5. The FIG. 1 graph shows this in more detail, in that it plots the optical constants n and k versus wavelength for CdSnOx layers have resistivities less than about 0.4 mohm-cm and greater than about 10 mohm-cm. FIG. 1 shows that a thin film of cadmium stannate may have a resistivity of less than about 0.4 mohm-cm, and therefore can be used as the conductive layer in thin film solar cells. FIG. 1 also shows that a thin film of cadmium stannate may have a resistivity of more than 10 mohm-cm, and therefore can be used as the buffer layer in a solar cell/photovoltaic device.

In certain example embodiments, using both a TCO layer based on cadmium stannate and a buffer layer based on cadmium stannate may be advantageous. Providing a TCO layer and a buffer layer of a CdSnOx may be advantageous, for example, because it simplifies material requirements and provides good adhesion between the layers. This is made possible through the use of two separate layers having the same constituent elements (namely, Cd, Sn, and O) but with different amounts of each constituent element, thereby affecting the resistivity/conductivity and index of refraction of the two layers. In certain example embodiments, sputtering targets with the the same or similar compositions may be provided. The two different layers may thus be sputtered from the same or similar targets using varied process conditions (e.g., increased oxygen contents for the more resistive/less conductive layer). The sputtering may in certain example embodiments be performed in-line in a single coated in certain example embodiments, e.g., when the process conditions in different portions (e.g., chambers) of the in-line coater may be varied.

Figure 2:
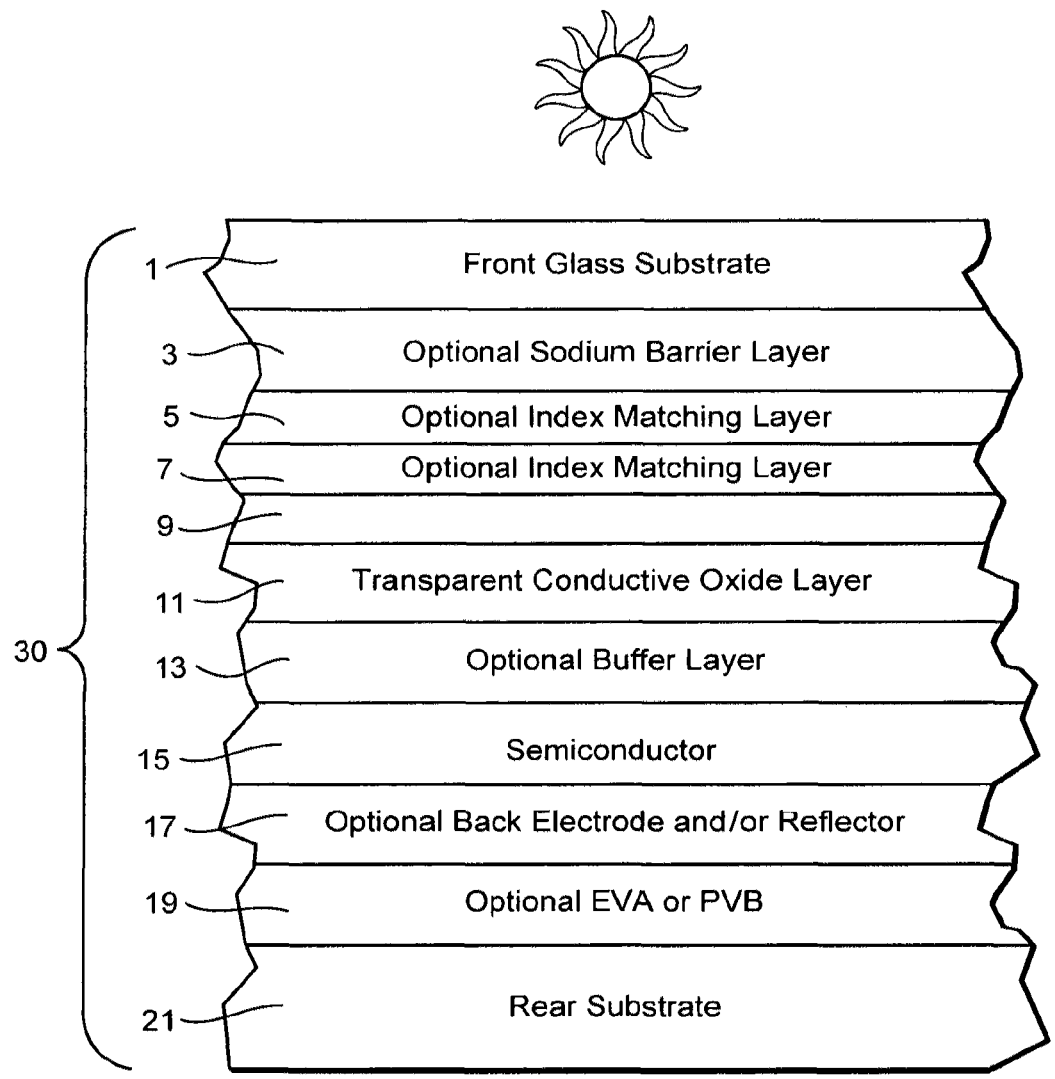
FIG. 2 is a cross-sectional view of a photovoltaic device according to certain example embodiments of this invention.

Turning once again to the drawings, FIG. 2 is a cross-sectional view of a photovoltaic device 30 according to certain example embodiments of this invention. The photovoltaic device 30 includes a transparent front substrate 1 of glass or the like, an optional sodium barrier layer 3, a plurality of index matching layers 5, 7, and/or 9, front electrode or contact 11 which may be of or include a transparent conductive oxide (TCO) such as cadmium stannate, indium tin oxide, and/or the like, a buffer layer 13, an active semiconductor film 15 comprising one or more semiconductor layers, optional back electrode and/or reflector 17 which may be of or include a metal such as silver or alternatively may be of or include a TCO, an optional encapsulant 19 or adhesive of a material such as ethyl vinyl acetate (EVA), polyvinyl butyral (PVB), or the like, and an optional rear substrate 21 of a material such as glass or the like. The semiconductor layer(s) of film 15 may be of or include one or more of CdTe, CdS, a-Si, or another other suitable semiconductor material, in different example embodiments of this invention. Of course, other layer(s) which are not shown may be provided in the device, such as between the front glass substrate 1 and the front electrode 11, or between other layers of the device. Back electrode layer 17, optional EVA or PVB layer 19, and rear substrate 21 are all optional layers. Front glass substrate 1 is the light-incident substrate, and may support a plurality of thin film layers including the optional barrier layer 3, optional index-matching layers 5, 7, and/or 9, transparent conductive oxide layer 11 to function as the front contact/electrode, optional buffer layer 13, and semiconductor 15, which may be based on CdTe and/or CdS in certain example embodiments.

It may be advantageous to provide a photovoltaic device including a sodium barrier layer, an index matching film stack, at least one transparent conductive layer, and a buffer layer, deposited by sputtering such as shown in FIG. 1. In certain instances, a photovoltaic device according to certain examples of this invention may have (a) high transmittance into semiconductors such as CdS and CdTe; (b) low absorption; and (c) lower cost than stacks with sheet resistance relying entirely on ITO.

The sodium barrier layer 3 is provided directly on the glass substrate 1 in certain example embodiments. In certain instances, the sodium barrier layer may have a refractive index of approximately 1.5 at 550 nm.

The FIG. 2 example includes a plurality of index matching layers. However, more or fewer layers may be provided in different embodiments of this invention. For instance, multiple high/low index layers may be provided in certain example embodiments. In certain example embodiments, a single index matching layer (e.g., one of layers 5, 7 and/or 9) may be provided. In still other example embodiments, a single graded index layer may be provided. For instance, a layer may be oxygen graded such that the refractive index also is graded from high to low, e.g., moving away from the substrate 1. Further example details regarding possible index matching layers are provided below in connection with FIGS. 3-6.

Figure 3:
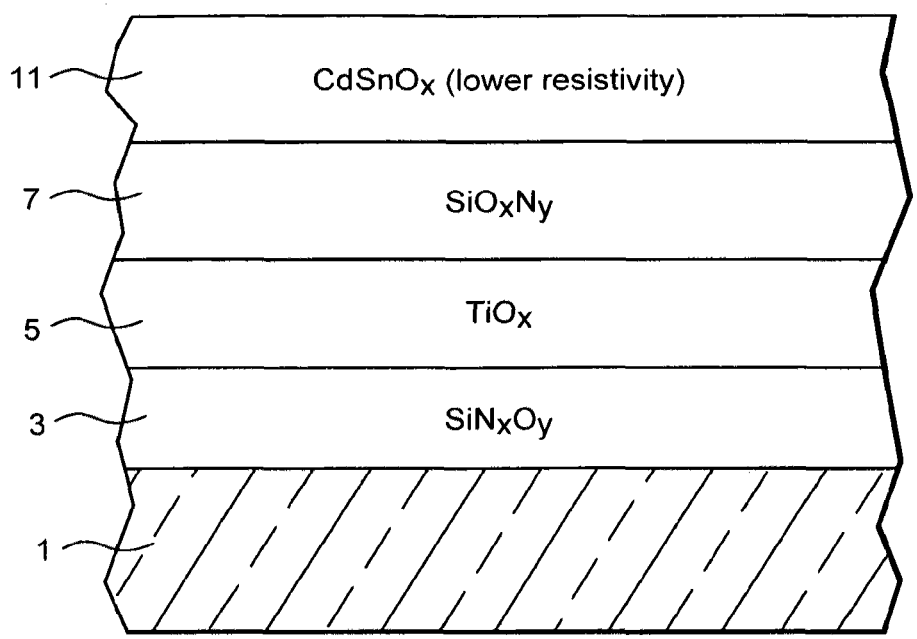
FIG. 3 is a cross-sectional view of a layer stack comprising a sodium barrier layer, index matching layers, and a TCO layer, according to certain example embodiments of this invention.

FIG. 3 is a cross-sectional view of a layer stack comprising a sodium barrier layer 3, index matching layers 5 and 7, and a TCO layer 11 comprising CdSnOx, according to certain example embodiments of this invention. The glass substrate 1 may be low iron soda lime silica glass in certain example embodiments. Example low-iron glass substrates are disclosed in, for example, U.S. application Ser. No. 12/385,318, as well as in U.S. Publication Nos. 2006/0169316; 2006/0249199; 2007/0215205; 2009/0223252; 2010/0122728; and 2009/0217978, the entire contents of each of which are hereby incorporated herein by reference.

The sodium barrier layer 3 may be a silicon-inclusive layer. For instance, the sodium barrier layer 3 may comprise silicon oxide, silicon nitride, silicon oxynitride (e.g., $SiO_xN_y$), etc., in certain example embodiments. Though layer 7 may comprise $SiO_xN_y$, y may be 0 or close to 0 in certain example embodiments. Any other material with a suitable index of refraction and ability to block sodium effusion/diffusion may be used in example embodiments.

Index-matching layers 5 and 7 may both be present in certain example embodiments, as is the case in the FIG. 3 example embodiment. In certain example embodiments, index-matching layer 5 has a high index of refraction, and may comprise a higher-index material such as titanium oxide. Layer 5 may be from about 5 to 50 nm in thickness, more preferably, about 5 to 25 nm, even more preferably from about 10 to 20 nm in thickness, with an example non-limiting thickness of 15 nm. In certain example embodiments, particularly when layers 5 and 7 are both present, layer 5 may have a higher index of refraction than layer 7. For example, layer 5 may have an index of refraction of from about 2.0 to 2.6, more preferably from about 2.1 to 2.6, and most preferably from about 2.2 to 2.6, with an example, non-limiting refractive index of about 2.4 (all at 550 nm).

Index-matching layer 7 may comprise a lower index layer such as silicon oxide and/or silicon oxynitride in certain examples. Layer 7 may be from about 10 to 60 nm thick, more preferably from about 15 to 55 nm thick, and even more preferably from about 25 to 45 nm thick, with an example non-limiting thickness of about 35 nm. In certain example embodiments, particularly when layers 5 and 7 are both present, layer 7 may have a lower index of refraction than layer 5. For example, layer 7 may have an index of refraction of from about 1.4 to 1.8, and more preferably from about 1.4 to 1.6, with an example, non-limiting refractive index being about 1.5 (all at 550 nm). Though layer 7 may comprise $SiO_xN_y$, in certain example embodiments y may be 0 or close to 0.

Transparent conductive oxide layer 11 may comprise cadmium stannate in certain example embodiments. The cadmium stannate may be stoichiometric or non-stoichiometric in different implementations. In certain example embodiments, a TCO layer based on cadmium stannate may have a high figure of merit. The cadmium stannate-based TCO layer may have a resistivity of from about 0.01 to 1 mohm-cm, more preferably from about 0.1 to 0.4, and most preferably from about 0.13 to 0.4 mohm-cm. The cadmium stannate-based TCO layer may have an index of refraction of from about 1.8 to 2.2, more preferably from about 2.0 to 2.2, with an example index of refraction of a cadmium stannate-based TCO layer being about 2.0 or 2.1. The presence of the one or more index matching layers as described herein may help overcome the high optical mismatch between the glass substrate 1 and the CdSnOx based layer 11 in certain example instances.

In other example embodiments, the TCO layer may comprise a material other than cadmium stannate. For example, in certain situations, such as when cost is not an issue, indium tin oxide may be used as the TCO layer. In other instances, cadmium stannate and ITO may be used in conjunction with one another as the TCO layer(s) in a photovoltaic device, as separate, discrete layers, as one mixed layer, etc., according to certain example embodiments.

TCO layer 11 may have a thickness of from about 100 to 1000 nm, more preferably from about 150 to 550 nm, even more preferably from about 250 to 450 nm, and most preferably from about 300 to 400 nm.

Figure 4:
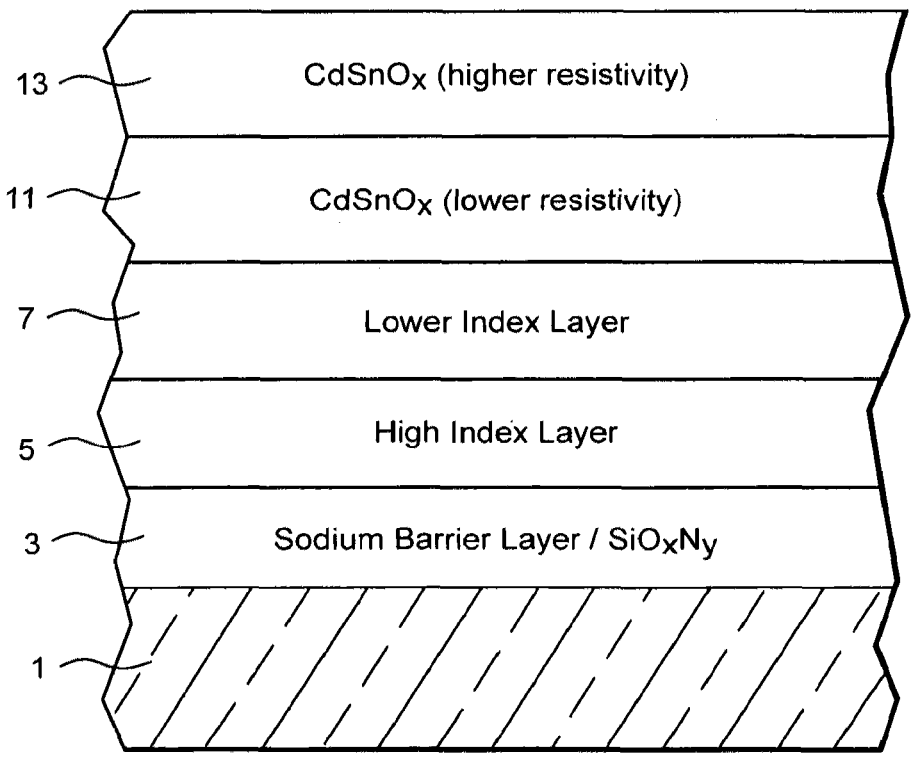
FIG. 4 is a cross-sectional view of a layer stack comprising a sodium barrier layer, index matching layers, a TCO layer, and a buffer layer, according to certain example embodiments of this invention.

In certain example embodiments, e.g., as shown in FIG. 4, a buffer layer 13 may be provided over TCO layer 11. In certain example embodiments, the refractive index of the buffer layer 13 may be higher than that of TCO layer 11.

The buffer layer 13 may comprise cadmium stannate in certain example embodiments. The cadmium stannate used for the buffer layer 13 may in certain examples have a higher resistivity than the cadmium stannate used for TCO layer 11. This example arrangement is shown in FIG. 4. FIG. 4 is similar to FIG. 3 in that its substrate 1 supports, in order moving away from the substrate 1, a silicon-inclusive barrier layer 3, a high index layer 5, and a low index layer 7. It is noted that in the drawings, the TCO layer based on cadmium stannate is referred to as having a lower resistivity whereas the buffer layer based on cadmium stannate is referred to as having a higher resistivity. It will be appreciated that these are relative terms that compare the conductivity/resisitivity as between these two layers. Thus, it will be appreciated that these terms are not absolutes in terms of conductors and insulators. In certain instances, the buffer layer has a thickness of from about 10 to 100 nm, more preferably from about 25 to 75 nm, even more preferably from about 20 to 50 nm, with an example thickness of about 50 nm. In other example embodiments, the buffer layer 13 may comprise tin oxide, e.g., as described in greater detail below in connection with FIG. 5.

Figure 5:
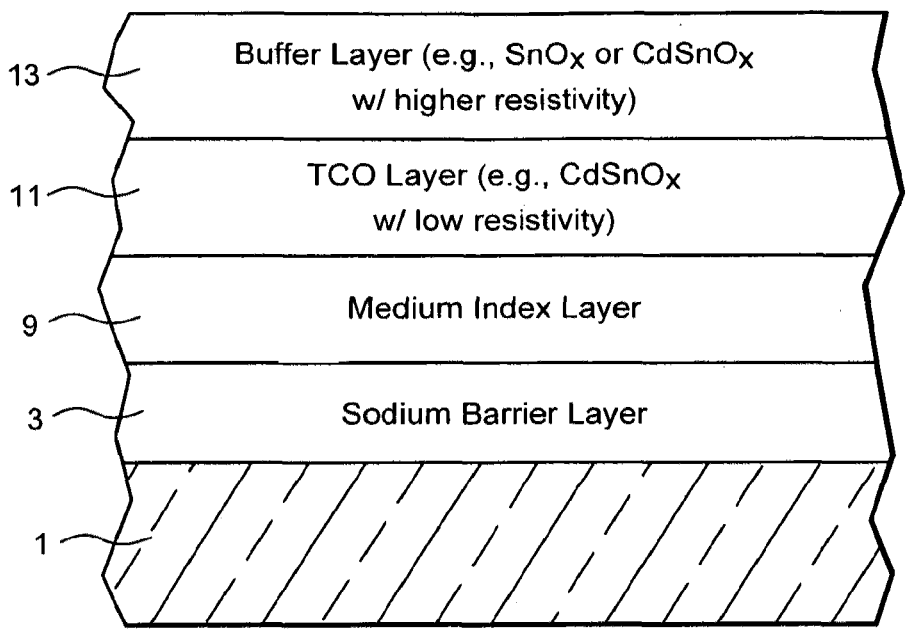
FIG. 5 is a cross-sectional view of a layer stack similar to the FIG. 4 layer stack, except that the high and low index matching layers have been replaced by one medium index layer, in accordance with certain example embodiments.

FIG. 5 also is similar to FIGS. 3 and 4, in that it contains a glass substrate 1 supporting a barrier layer 3, a TCO layer 11 (e.g., of or including CdSnOx) having a low resistivity and a buffer layer 13 (e.g., of or including CdSnOx, SnOx, or the like) with a resistivity higher than that of the TCO layer 11. A tin oxide buffer layer of from about 20-50 nm may be provided even where a CdSnOx buffer layer is provided.

As mentioned above, in certain example embodiments, only one of layers 5 and 7 may be present, both layers may be replaced by medium index layer 9 or a single graded layer, etc. In example embodiments where only a single index-matching layer is provided, the index matching layer present may have a refractive index of from about 1.5 to 2.0, more preferably from about 1.6 to 1.9, and most preferably from about 1.7 to 1.8, with an example, non-limiting refractive index for a single index-matching layer being about 1.75. In certain instances, when only a single index-matching layer is present, the layer may comprise silicon oxynitride. In certain example embodiments, a single graded layer may be provided. In such example instances, the layer may be graded from high to low, and the average index may be in the ranges described above (from about 1.5 to 2.0, more preferably from about 1.6 to 1.9, and most preferably from about 1.7 to 1.8, with an example, non-limiting refractive index for a single index-matching layer being about 1.75) in such example instances. The FIG. 5 example embodiment includes a single medium index layer 9, e.g., in place of the high and low index layers 5 and 7 shown in FIGS. 3 and 4. Of course, in different embodiments of this invention, a medium index layer 9 may be provided in addition to one or more sets of high and/or low index layers.

Figure 6:
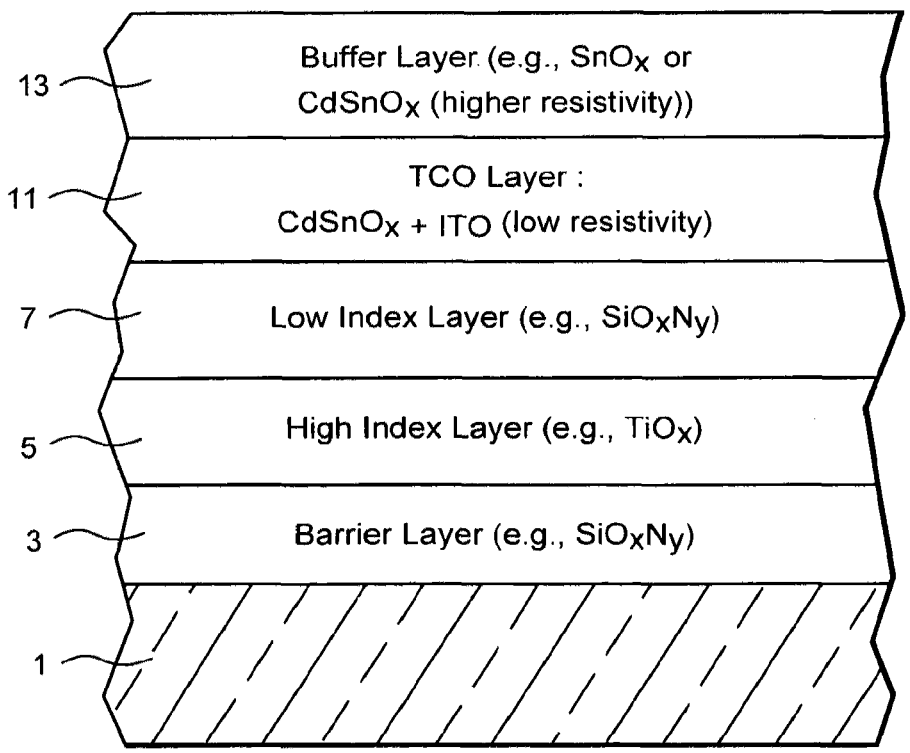
FIG. 6 is a cross-sectional view of a layer stack in which the transparent conductive oxide layer comprises both cadmium stannate and indium tin oxide, in accordance with certain example embodiments of this invention.

FIG. 6 includes barrier layer 3, index matching layers 5 and 7 (which may be replaced by a medium index layer 9, e.g., as described above in connection with FIG. 5), buffer layer 13, and a TCO layer based both on cadmium stannate and indium tin oxide. It will be appreciated that ITO also has a high figure of merit. Thus, a TCO layer comprising or consisting essentially of ITO may be used in place of or in addition to a CdSnOx TCO layer in certain example embodiments of this invention.

In certain example embodiments, some or all of layers 3-13 may be sputter-deposited. For instance, such layers may be sputtered from ceramic or metal targets, at room temperature, or at elevated temperatures. In certain example embodiments, sputtered coatings advantageously have excellent uniformity and reproducibility.

In some instances, other layer(s) below, within, or above the illustrated coating 30 may also be provided. Thus, while the layer system or coating is "on" or "supported by" substrate 1 (directly or indirectly), other layer(s) may be provided therebetween. Thus, for example, the individual layers described herein may be considered "on" and "supported by" the substrate 1 even if other layer(s) are provided between the particular layer and the substrate 1. "Substrate" 1 may refer to a substrate and/or a superstrate, according to different example embodiments. Moreover, certain layers of the illustrated coating may be removed in certain embodiments, and other layers added in other embodiments of this invention without departing from the overall spirit of certain embodiments of this invention.

Coated articles according to different embodiments of this invention may or may not be heat treated (HT) in different instances. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes.

Figure 7:
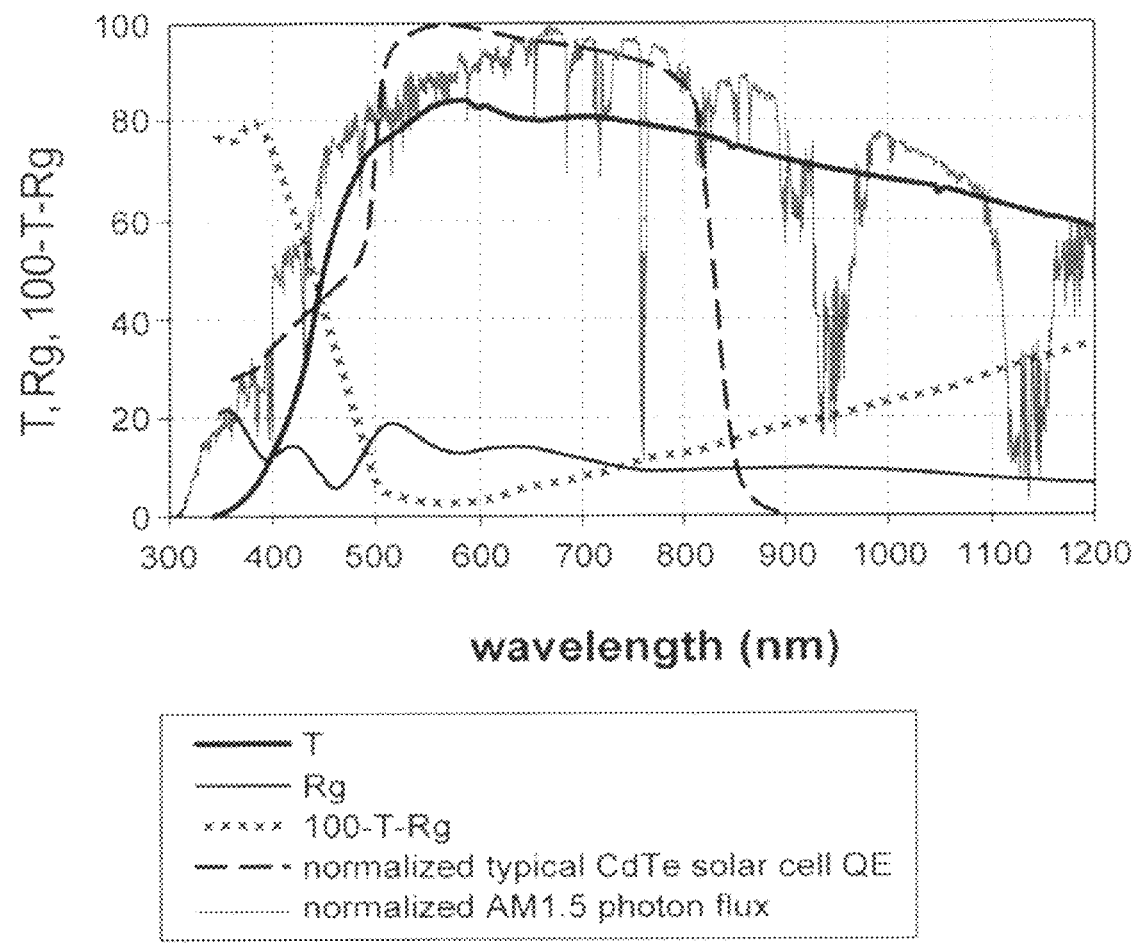
FIG. 7 is a graph of the transmission and reflection spectra of a layer stack made according to the FIG. 3 example embodiment.

FIG. 7 shows the transmission and reflection spectra where the coating of FIG. 3 is applied to a 3.2 mm thick soda lime silica glass substrate. FIG. 7 demonstrates that the layer of FIG. 3 has high transparency in the high solar flux and a CdTe solar cell sensitive wavelength range (e.g., through the visible spectrum and into the IR spectrum). The transparent conductive coating of FIG. 3 has a sheet resistance of about 10 ohms/square, and an average absorption losses less than 7% and 10% in wavelength ranges from 500-800 nm and 450-850 nm, respectively.

Figure 8:
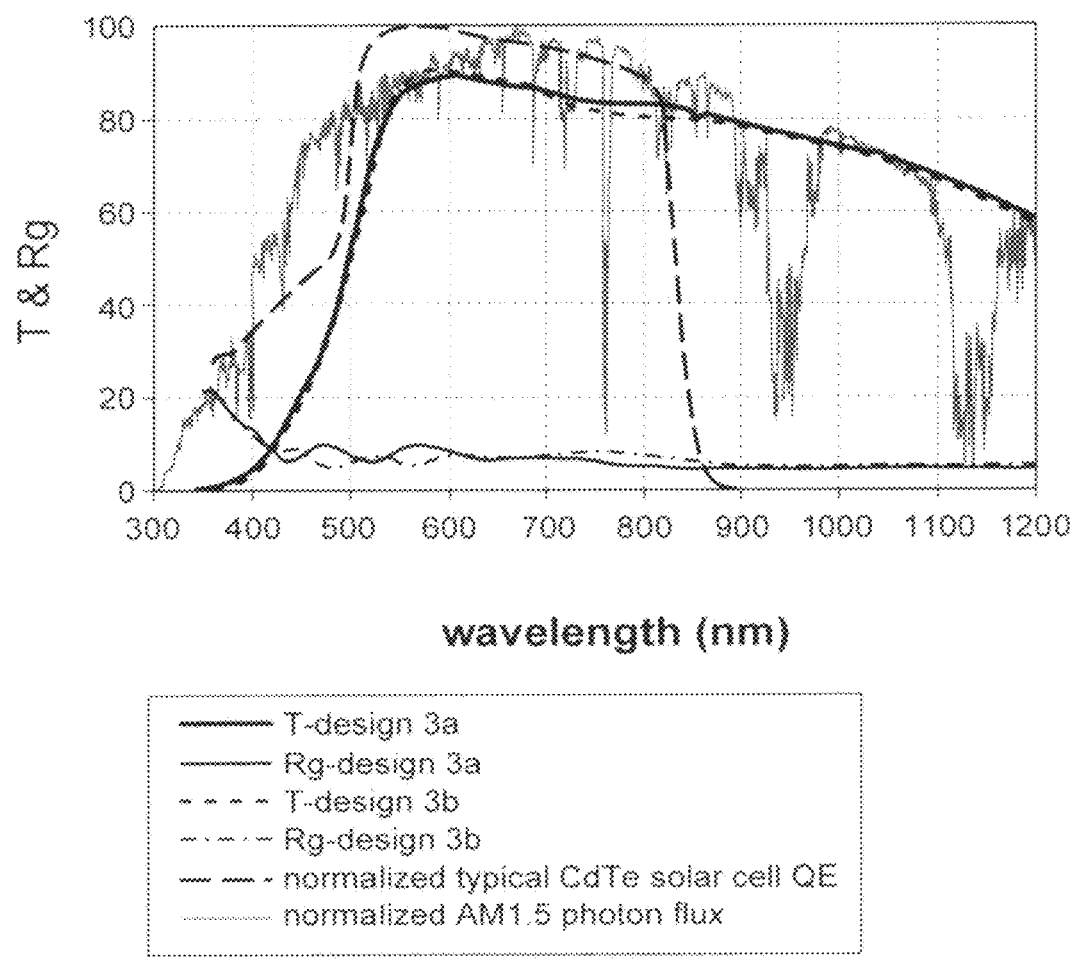
FIG. 8 is a graph of the reflections from a glass surface of a CdS/CdTe solar cell stack, and the transmission of light into the CdTe layer having 100 nm CdS as the window layer atop a cadmium stannate-based TCO superstrate, according to certain example embodiments.

FIG. 8 shows reflections from the glass surface of a completed CdS/CdTe solar cell stack, and the transmission of light into the CdTe layer having a 100 nm layer of CdS as the window layer atop a cadmium stannate-based TCO superstrate (e.g., incorporating the example stacks shown in FIG. 3 or FIG. 4). The average reflection for the wavelength range from 500-800 nm is approximately less than 7%, and the average transmission in that wavelength range is greater than or equal to 82%.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A photovoltaic device, comprising:
    a front glass substrate and a plurality of thin film layer disposed thereon, the thin film layers comprising, in order moving outwardly from the front glass substrate:
        at least one index-matching layer,
        a transparent conductive oxide (TCO) layer comprising CdSnOx,
        a buffer layer comprising CdSnOx, wherein the buffer layer comprising CdSnOx has a resistivity higher than a resistivity of the TCO layer comprising CdSnOx,
        a semiconductor film comprising CdTe and/or CdS, and
        a rear contact layer, and
    a rear glass substrate; wherein the buffer layer comprising CdSnOx has a thickness from about 20 to 50 nm and a resistivity of at least about 10 mohm-cm.

2. The photovoltaic device of claim 1, wherein the TCO layer comprising CdSnOx has an index of refraction of from about 1.8 to 2.2.

3. The photovoltaic device of claim 1, wherein the buffer layer comprising CdSnOx has an index of refraction higher than an index of refraction of the TCO layer comprising CdSnOx.

4. The photovoltaic device of claim 1, wherein the TCO layer comprising CdSnOx has a resistivity of from about 0.1 to 0.4 mohm-cm.

5. The photovoltaic device of claim 4, wherein the TCO layer comprising CdSnOx has a thickness of from about 300 to 400 nm.

6. The photovoltaic device of claim 1, further comprising a sodium barrier layer contacting the front glass substrate and interposed between the front glass substrate and the at least one index-matching layer,
    wherein the at least one index-matching layer comprises a first index matching layer provided over and contacting the barrier layer, and a second index matching layer provided over and contacting the first index matching layer, and
    wherein the first index matching layer has a higher index of refraction than the second index matching layer.

7. The photovoltaic device of claim 1, wherein the photovoltaic device comprises only one index matching layer, having an index of refraction of from about 1.7 to 1.8.

8. A photovoltaic device, comprising:
    a front glass substrate and a plurality of thin film layer disposed thereon, the thin film layers comprising, in order moving outwardly from the front glass substrate:
        a sodium barrier layer;
        a plurality of index matching layers including at least a high-index titanium oxide inclusive layer and a low index silicon-inclusive layer;
        a transparent conductive oxide (TCO) layer comprising CdSnOx;
        a buffer layer comprising CdSnOx, wherein the buffer layer has a higher resistivity than a resistivity of the TCO layer comprising CdSnOx; and
        a semiconductor film comprising CdS and/or CdTe;
        wherein the buffer layer comprising CdSnOx has a thickness from about 20 to 50 nm and a resistivity of at least about 10 mohm-cm.

9. The photovoltaic device of claim 8, wherein the TCO layer comprising CdSnOx has an index of refraction of from about 1.8 to 2.2.

10. The photovoltaic device of claim 8, wherein the buffer layer comprising CdSnOx has an index of refraction higher than an index of refraction of the TCO layer comprising CdSnOx.

11. The photovoltaic device of claim 8, wherein the buffer layer comprising CdSnOx has an index of refraction of from about 2.0 to 2.5.

12. The photovoltaic device of claim 8, wherein the TCO layer comprising CdSnOx has a resistivity of from about 0.1 to 0.4 mohm-cm.

13. The photovoltaic device of claim 12, wherein the TCO layer comprising CdSnOx has a thickness of from about 300 to 400 nm.

14. A method of making a photovoltaic device, the method comprising:
    providing a front glass substrate;
    sputter-depositing a barrier layer directly on the front glass substrate;
    sputter-depositing at least one index matching layer onto the glass substrate, over and contacting the barrier layer;
    sputter-depositing a transparent conductive oxide (TCO) layer comprising CdSnOx and having a resistivity of no greater than 0.4 mohm-cm and a refractive index from about 1.8 to 2.2, directly or indirectly, on the at least one index matching layer; and
    sputter-depositing a buffer layer comprising CdSnOx directly on the TCO layer, the buffer layer having a thickness from about 20 to 50 nm and a resistivity of at least about 10 mohm-cm.

15. The method of claim 14, wherein the buffer layer comprising CdSnOx has a higher index of refraction than that of the TCO layer comprising CdSnOx.

16. The method of claim 14, further comprising sputter-depositing the buffer layer comprising CdSnOx in an environment containing more oxygen than an environment in which the TCO layer comprising CdSnOx is deposited.

* * * * *